(12) United States Patent
Conley

(10) Patent No.: US 7,970,987 B2
(45) Date of Patent: *Jun. 28, 2011

(54) PARTIAL BLOCK DATA PROGRAMMING AND READING OPERATIONS IN A NON-VOLATILE MEMORY

(75) Inventor: Kevin M. Conley, San Jose, CA (US)

(73) Assignee: Sandisk Corporation, Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/900,397

(22) Filed: Oct. 7, 2010

(65) Prior Publication Data

US 2011/0029724 A1    Feb. 3, 2011

Related U.S. Application Data

(63) Continuation of application No. 11/250,238, filed on Oct. 13, 2005, now Pat. No. 7,818,490, which is a continuation of application No. 10/841,388, filed on May 7, 2004, now Pat. No. 6,968,421, which is a continuation of application No. 09/766,436, filed on Jan. 19, 2001, now Pat. No. 6,763,424.

(51) Int. Cl.
  *G06F 12/00* (2006.01)
(52) U.S. Cl. ............................ 711/103; 711/115
(58) Field of Classification Search ............ 711/103
  See application file for complete search history.

(56) References Cited

U.S. PATENT DOCUMENTS

| | | |
|---|---|---|
| 5,043,940 A | 8/1991 | Harari |
| 5,172,338 A | 12/1992 | Mehrotra et al. |
| 5,341,330 A | 8/1994 | Wells et al. |
| 5,388,083 A | 2/1995 | Assar et al. |
| 5,388,248 A | 2/1995 | Robinson et al. |
| 5,404,485 A | 4/1995 | Ban |
| 5,457,658 A | 10/1995 | Niijima et al. |
| 5,479,638 A | 12/1995 | Assar et al. |

(Continued)

FOREIGN PATENT DOCUMENTS

EP    0 250 876 A    5/1987

(Continued)

OTHER PUBLICATIONS

European Patent Office, "Communication Pursuant to Article 96(2) EPC" mailed in related European patent application No. 02703078.2-2210 on Dec. 2, 2004, 3 pages.

(Continued)

*Primary Examiner* — Tuan V Thai
*Assistant Examiner* — Ngoc V Dinh
(74) *Attorney, Agent, or Firm* — Davis Wright Tremaine LLP

(57) ABSTRACT

Data in less than all of the pages of a non-volatile memory block are updated by programming the new data in unused pages of either the same or another block. In order to prevent having to copy unchanged pages of data into the new block, or to program flags into superceded pages of data, the pages of new data are identified by the same logical address as the pages of data which they superceded and a time stamp is added to note when each page was written. When reading the data, the most recent pages of data are used and the older superceded pages of data are ignored. This technique is also applied to metablocks that include one block from each of several different units of a memory array, by directing all page updates to a single unused block in one of the units.

16 Claims, 9 Drawing Sheets

U.S. PATENT DOCUMENTS

| | | | |
|---|---|---|---|
| 5,481,691 | A | 1/1996 | Day, III et al. |
| 5,485,595 | A | 1/1996 | Assar et al. |
| 5,544,356 | A | 8/1996 | Robinson et al. |
| 5,568,439 | A | 10/1996 | Harari |
| 5,598,370 | A | 1/1997 | Niijima |
| 5,627,783 | A | 5/1997 | Miyauchi |
| 5,648,929 | A | 7/1997 | Miyamoto |
| 5,649,200 | A | 7/1997 | Leblang et al. |
| 5,682,499 | A | 10/1997 | Bakke et al. |
| 5,740,396 | A | 4/1998 | Mason |
| 5,822,781 | A | 10/1998 | Wells et al. |
| 5,835,935 | A | 11/1998 | Estakhri et al. |
| 5,838,614 | A | 11/1998 | Estakhri et al. |
| 5,845,313 | A | 12/1998 | Estakhri et al. |
| 5,860,090 | A | 1/1999 | Clark |
| 5,860,124 | A | 1/1999 | Matthews et al. |
| 5,867,417 | A | 2/1999 | Wallace et al. |
| 5,890,192 | A | 3/1999 | Lee et al. |
| 5,896,393 | A | 4/1999 | Yard et al. |
| 5,907,856 | A | 5/1999 | Estakhri et al. |
| 5,924,092 | A | 7/1999 | Johnson |
| 5,924,113 | A | 7/1999 | Estakhri et al. |
| 5,937,425 | A | 8/1999 | Ban |
| 5,986,933 | A | 11/1999 | Takeuchi et al. |
| 5,987,478 | A * | 11/1999 | See et al. ............................ 1/1 |
| 5,987,563 | A | 11/1999 | Itoh et al. |
| 5,999,947 | A | 12/1999 | Zollinger et al. |
| 6,023,423 | A | 2/2000 | Aritome |
| 6,034,897 | A | 3/2000 | Estakhri et al. |
| 6,040,997 | A | 3/2000 | Estakhri et al. |
| 6,078,520 | A * | 6/2000 | Tobita et al. ............. 365/185.09 |
| 6,115,785 | A | 9/2000 | Estakhri et al. |
| 6,122,195 | A | 9/2000 | Estakhri et al. |
| 6,125,435 | A | 9/2000 | Estakhri et al. |
| 6,134,151 | A | 10/2000 | Estakhri et al. |
| 6,151,247 | A | 11/2000 | Estakhri et al. |
| 6,161,163 | A | 12/2000 | Komatsu et al. |
| 6,202,138 | B1 | 3/2001 | Estakhri et al. |
| 6,219,752 | B1 | 4/2001 | Sekido |
| 6,219,768 | B1 | 4/2001 | Hirabayashi et al. |
| 6,223,308 | B1 | 4/2001 | Estakhri et al. |
| 6,262,918 | B1 | 7/2001 | Estakhri et al. |
| 6,288,862 | B1 | 9/2001 | Baron et al. |
| 6,330,633 | B1 | 12/2001 | Kusakabe et al. |
| 6,330,634 | B1 | 12/2001 | Fuse et al. |
| 6,426,893 | B1 | 7/2002 | Conley et al. |
| 6,449,625 | B1 | 9/2002 | Wang |
| 6,567,307 | B1 | 5/2003 | Estakhri |
| 6,584,579 | B1 | 6/2003 | Komatsu et al. |
| 6,684,289 | B1 | 1/2004 | Gonzalez et al. |
| 6,715,068 | B1 | 3/2004 | Abe |
| 6,725,321 | B1 | 4/2004 | Sinclair et al. |
| 6,763,424 | B2 | 7/2004 | Conley |
| 6,839,285 | B2 | 1/2005 | Zink et al. |
| 6,845,438 | B1 | 1/2005 | Tanaka et al. |
| 6,925,012 | B2 | 8/2005 | Yamagami et al. |
| 6,947,332 | B2 | 9/2005 | Wallace et al. |
| 6,968,421 | B2 | 11/2005 | Conley |
| 7,167,944 | B1 | 1/2007 | Estakhri |
| 7,657,702 | B2 | 2/2010 | Conley |
| 2002/0097594 | A1* | 7/2002 | Bruce et al. ..................... 365/49 |

FOREIGN PATENT DOCUMENTS

| | | | |
|---|---|---|---|
| EP | 0 896 280 | A | 2/1999 |
| EP | 0 977 121 | A | 7/1999 |
| EP | 1 352 394 | B1 | 5/2006 |
| FR | 2 742 893 | A | 12/1995 |
| JP | H06-250798 | A | 9/1994 |
| JP | 8-212019 | A | 8/1996 |
| JP | H08-221223 | A | 8/1996 |
| JP | H10-091490 | A | 4/1998 |
| JP | H10-91490 | A | 4/1998 |
| JP | H10-105661 | A | 4/1998 |
| JP | 11-110300 | A | 4/1999 |
| JP | 2000-163302 | A | 6/2000 |
| JP | P3070539 | B2 | 7/2000 |
| WO | WO 94/20906 | A | 9/1994 |
| WO | WO 94/22075 | A | 9/1994 |
| WO | WO 97/43764 | A1 | 11/1997 |
| WO | WO 98/44420 | A | 10/1998 |
| WO | WO 99/07000 | A | 2/1999 |
| WO | WO 99/21093 | A | 4/1999 |
| WO | WO 00/49488 | A1 | 8/2000 |
| WO | WO 00/60605 | A1 | 10/2000 |
| WO | WO 02/49039 | A2 | 6/2002 |
| WO | WO 02/49309 | A2 | 6/2002 |
| WO | WO 02/058074 | A2 | 7/2002 |

OTHER PUBLICATIONS

"International Preliminary Examination Report", European Patent Office, Corresponding Application PCT/US02/00366, Jul. 4, 2003, 7 pages.

"FTL Updates, PCMCIA Document No. 0165", Personal Computer Memory Card International Association, Version 002, Release 003, Mar. 4, 1996, pp. 1-26.

Mergi, Aryeh and Schneider, Robert, "M-Systems & SCM Flash Filing Software Flash Translation Layer—FTL", PCMCIA, Jul. 1994, 15 pages.

Petro Estakhri et al., "Moving Sectors Within a Block of Information in a Flash Memory Mass Storage Architecture", U.S. Appl. No. 09/620,544, filed Jul. 21, 2000, 48 pages.

PCT International Search Report, European Patent Office, corresponding PCT Application No. PCT/US02/00366, Jul. 4, 2003, 5 pages.

The Patent Office of the People's Republic of China, "Notification of the First Office Action," mailed in related Chinese Application No. 02803882.7 on Jan. 27, 2006, 14 pages, including translation.

Notice of Opposition to a European Patent for SanDisk Corporation, Patent No. 1,352,394, Application No. 02703078.2, dated Mar. 1, 2007, 17 pages.

Notification of Reasons for Refusal for SanDisk Corporation, Japanese Patent Application No. 2002-558275, mailed Feb. 23, 2007, 10 pages.

Japanese Patent Office, "Decision of Refusal," corresponding Japanese Patent Application No. 2002-558275 on Nov. 27, 2007, 3 pages (including translation).

The Patent Office of the People's Republic of China, "Notification of the First Office Action," corresponding Chinese Patent Application No. 200610142358.3 on Dec. 14, 2007, 3 pages.

The Patent Office of the People's Republic of China, "Notification of the First Office Action," corresponding Chinese Patent Application No. 200610142359.8 on Dec. 14, 2007, 8 pages (including translation.

Japanese Patent Office, "Notification of Reasons for Refusal," corresponding Japanese Patent Application No. 2002-558275, mailed on May 13, 2008, 3 pages.

Korean Patent Office, "Office Action," corresponding Korean Patent Application No. 2003-7009551, mailed on Aug. 25, 2008, 14 pages (including translation.).

PCMCIA, PC Card Standard 6.0. PCMCIA Mar. 1997, vol. 1, Overview and Glossary, 29 pages.

PCMCIA, PC Card Standard 6.0. PCMCIA Mar. 1997, vol. 3, Physical Specification, 61 pages.

PCMCIA, PC Card Standard 6.0. PCMCIA Mar. 1997, vol. 7, Media Formats Storage, Specification, 39 pages.

Barre, "Flash Memory Magnetic Disk Replacement," IEEE Transactions on Magnetics, vol. 29, No. 6, Nov. 1993, 4 pages.

Chan, "World's Smallest Solid State Storage Device Sets New Industry Standard," IEEE, Nov. 4-6, 1997, pp. 484-487.

Wells et al. "Flash Solid State Drive with 6MB/s Read/Write Channel and Data Compression," ISSCC 93/Session 3/Non-Volatile, Dynamic, and Experimental Memories/Paper WP 3.6, 4 pages.

United States International Trade Commission, In the Matter of Certain Flash Memory Controllers, Drivers, Memory Cards, and Media Palyers and Products Containing same, Inv. No. 337-TA-619, Order No. 33: Order Construing the Terms of the Asserted Claims of the Patents at Issue, Jul. 15, 2008, pp. i-iii, 1-10 and 54-67.

Deposition of Kevin M. Conley dated Jul. 24, 2008, vol. I, 49 pages.

Deposition of Kevin M. Conley dated Jul. 25, 2008, vol. II, 35 pages.

Deposition of Kevin M. Conley dated Sep. 11, 2008, vol. III, 35 pages.
Exhibits No. 1 through No. 12, No. 15 through No. 22, No. 24 through No. 26, No. 28 through No. 32, to Deposition of Kevin M. Conley, dated Jul. 24 and Jul. 25, 2008, total 573 pages.
Exhibits No. 37 through No. 56, No. 58, No. 59, No. 61 through No. 72, to Deposition of Kevin M. Conley, dated Jul. 24 and Jul. 25, 2008, total 729 pages.
Deposition of John Mangan dated Jul. 10, 2008, vol. 1, 61 pages.
Deposition of John Mangan dated Jul. 11, 2008, vol. 2, 37 pages.
Exhibits No. 1 through No. 10 to the Deposition of John Mangan, dated Jul. 10 and Jul. 11, 2008, total 540 pages.
Exhibits No. 11 through No. 15, No. 17 through No. 25, No. 29, No. 31, No. 32 to the Deposition of John Mangan, dated Jul. 10 and Jul. 11, 2008, total 504 pages.
SanDisk Corporation, SDP-32 Mbit "Mizer" Low Cost HD, Logical Format 20-10-00050, Rev. 8, Dec. 5, 1997, 32 pages.
Sandisk Israel, MediaClip Memory Card MMC Controller Top Level Design, Version 0.1, Nov. 13, 1996, 74 pages.
SanDisk Corporation, Preliminary MultiMediaCard Product Manual, Apr. 28, 1998, 96 pages.
Photo International, Digital: SanDisk Introduces 64, 80, 96 and 160 MB CompactFlash Memory, Feb. 1999, 1 page.
Hsia et al., "A Reconfigurable Interconnect For In-Silicon Electronic Assembly", *IEEE*, (1982) pp. 7-16.
Hsia et al., "Adaptive Wafer Scale Integration", Proceeding of the 11$^{th}$ Conference (1979 International), *Japanese Journal of Applied Physics*, vol. 19 (1980) Supplement 19-1, pp. 193-202.
Hsia, "Memory Applications Of The MNOS", *1972 Wescon Technical Papers* vol. 16, (1972) pp. 1-5.
Niijima, "Design of a solid-state file using flash EEPROM," IBM J. Res. Develop, vol. 39, No. 5, Sep. 1995, 15 pages (as marked up by Dr. Harari).
Heller Ehrman, Letter from A. Sharma to J. Yoon identifying Heller's Respondents' Prior Art, dated Mar. 10, 2008, 7 pages.
United States International Trade Commission, Investigation No. 337-TA-619, Notice of Prior Art of Respondents Apacer Technology, Inc. and Apacer Memory America, Inc., Silicon Motion Technology Corporation, Silicon Motion, Inc. (Taiwan), Silicon Motion, Inc. (California) and Silicon Motion International, Inc., Transcend Information, Inc. (Taiwan), Transcend Information, Inc. (California) and Transcend Information Maryland, Inc., dated Jul. 11, 2008, 17 pages.
United States International Trade Commission, Investigation No. 337-TA-619, The Heller Respondents' Notice of Prior Art, dated Jul. 11, 2008, 23 pages.
United States International Trade Commission, Investigation No. 337-TA-619, Respondents Kingston Technology Co., Inc., Kingston Technology Corporation, Memosun, Inc., Payton Technology Corporation, and Phison Electronics Corporation's Notice of Prior Art, dated Jul. 11, 2008, 19 pages.
United States International Trade Commission, Investigation No. 337-TA-619, Respondents LG Electronics, Inc. and LG Electronics U.S.A., Inc's Notice of Prior Art, Jul. 11, 2008, 16 pages.
United States International Trade Commission, Investigation No. 337-TA-619, Niles Kynett's testimony dated Oct. 29, 2008, 22 pages.
United States International Trade Commission, Investigation No. 337-TA-619, Niles Kynett's testimony dated Oct. 30, 2008, 23 pages.
United States International Trade Commission, Investigation No. 337-TA-619, witness statement of Kevin Conley dated Oct. 9, 2008, 9 pages.
United States International Trade Commission, Investigation No. 337-TA-619, Professor M. Ray Mercer's testimony dated Nov. 3, 2008, 30 pages.
United States International Trade Commission, Investigation No. 337-TA-619, Dr. Thomas Rhyne's testimony dated Oct. 27, 2008, 86 pages.
United States International Trade Commission, Investigation No. 337-TA-619, Dr. Thomas Rhyne's testimony dated Oct. 28, 2008, 84 pages.
United States International Trade Commission, Investigation No. 337-TA-619, Dr. Thomas Rhyne's testimony dated Oct. 29, 2008, 34 pages.
United States International Trade Commission, Investigation No. 337-TA-619, Dr. Subramanian's testimony dated Oct. 30, 2008, 60 pages.
United States International Trade Commission, Investigation No. 337-TA-619, Dr. Subramanian's testimony dated Oct. 31, 2008, 59 pages.
V. Niles Kynett, "Expert Report on the Invalidity of the '424 Patent," dated Aug. 8, 2008, 99 pages (including Exhibit 4.).
Exhibits No. 16 through 28 from Kynett's Expert Report, dated Aug. 8, 2008, 331 pages.
Exhibits No. 36 through 41 from Kynett's Expert Report, dated Aug. 8, 2008, 69 pages.
Exhibits No. 46 through 57 from Kynett's Expert Report, dated Aug. 8, 2008, 157 pages.
Exhibits No. 65 through 72 from Kynett's Expert Report, dated Aug. 8, 2008, 63 pages.
Korean Patent Office, "Notice of Preliminary Rejections," corresponding Korean Patent Application No. 2008-7028861, mailed on Mar. 10, 2009, 8 pages (inlcuding translation.).
United States International Trade Commission, "*In the Matter of Certain Flash Memory Controllers, Drives, Memory Cards and Media Players, and Products Containing Same,*" Inv. No. 337-TA-619, Initial Determination on Violation of Section 337 and Recommended Determination on Remedy and Bond, Administrative Law Judge Charles E. Bullock, Public Version, May 5, 2009, 398 pages.
USPTO, "Notice of Allowance and Fee(s) Due," mailed in related U.S. Appl. No. 12/371,460 on Nov. 16, 2009, 24 pages.
Korean Patent Office,"Preliminary Rejection," corresponding Korean Patent Application No. 2008-7028861, mailed on Jan. 28, 2010, 11 pages (including translation.).
Korean Patent Office,"Preliminary Rejection," corresponding Korean Patent Application No. 2008-7028861, mailed on Jan. 28, 2010, 12 pages (including translation.).
EPO, "Examiner's Search Report,"corresponding European Patent Application No. 05 07 7929, mailed on Dec. 16, 2010, 3 pages.
EPO, "Examiner's Search Report,"corresponding European Patent Application No. 06 07 5106, mailed on Dec. 16, 2010, 3 pages.

\* cited by examiner

| LBN | PBN |
|---|---|
| 0 | 0 |
| ⋮ | ⋮ |

Original Block 11

| LBN | PBN |
|---|---|
| 0 | 1 |
| ⋮ | ⋮ |

With New Block 15

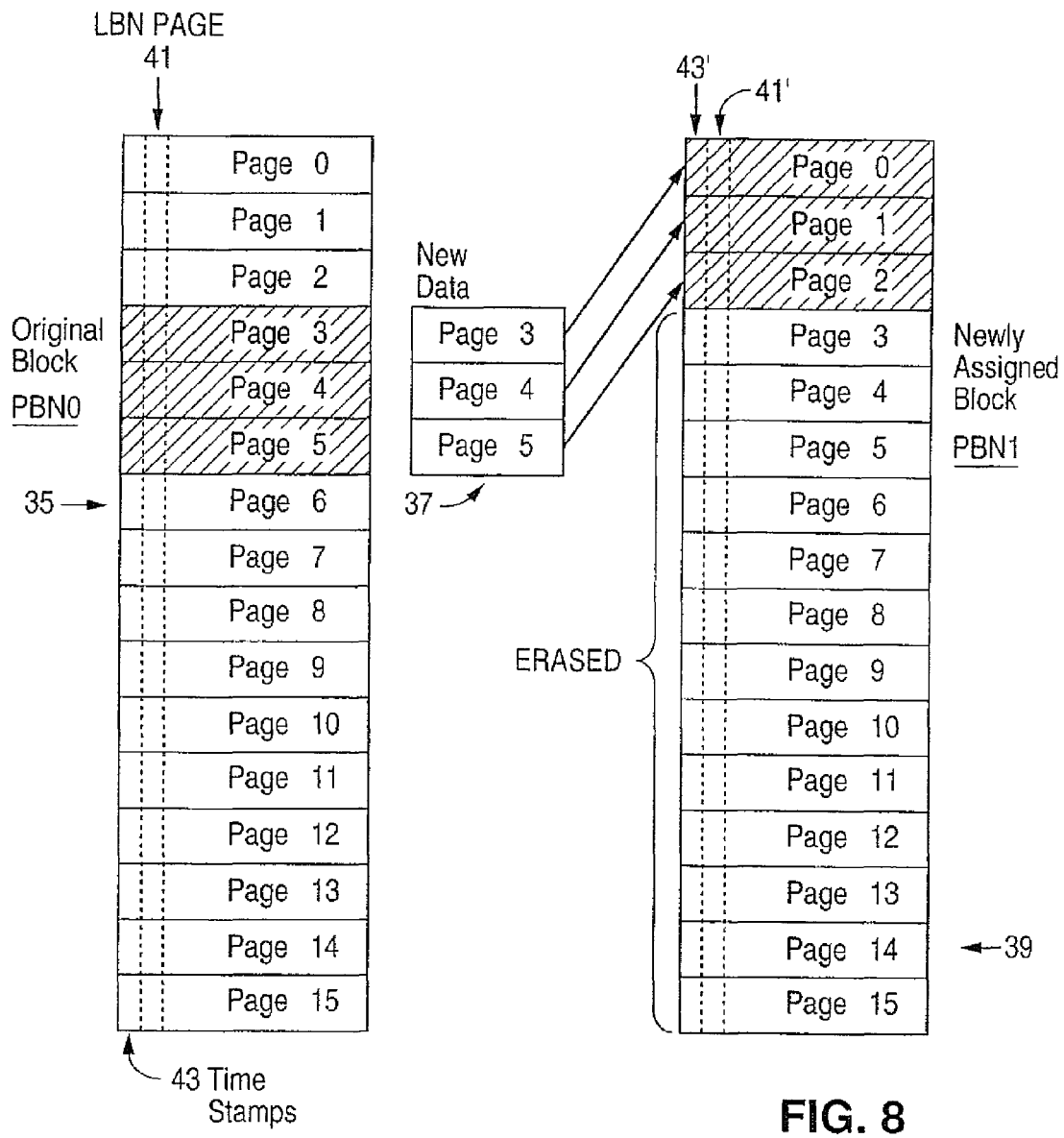

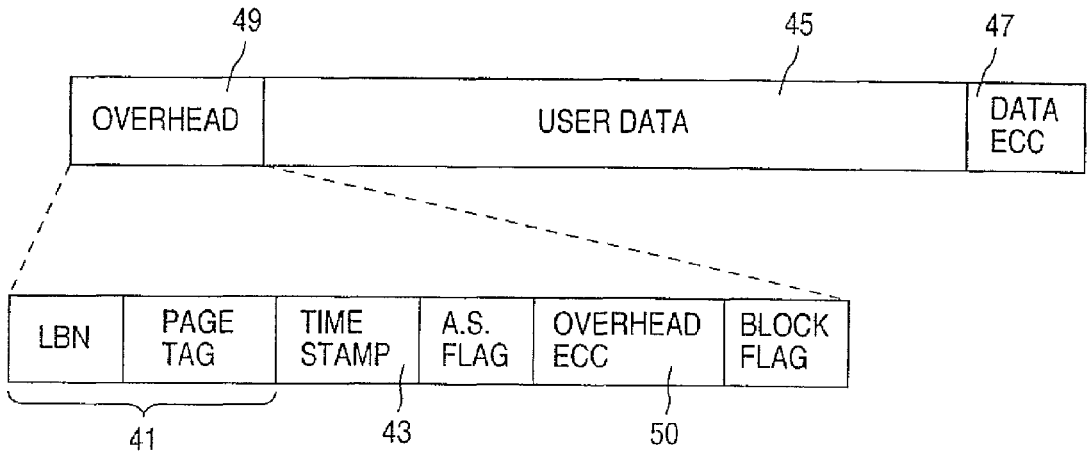
FIG. 10
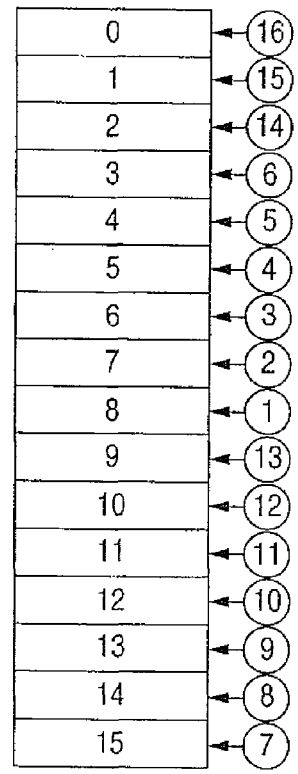
FIG. 12
FIG. 13

PARTIAL BLOCK DATA PROGRAMMING AND READING OPERATIONS IN A NON-VOLATILE MEMORY

CROSS-REFERENCE TO RELATED APPLICATION

This application is a continuation of application Ser. No. 11/250,238, filed Oct. 13, 2005, now U.S. Pat. No. 7,818,490, which is a continuation of application Ser. No. 10/841,388, filed May 7, 2004, now U.S. Pat. No. 6,968,421, which in turn is a continuation of application Ser. No. 09/766,436, filed Jan. 19, 2001, now U.S. Pat. No. 6,763,424, which applications are incorporated herein in their entirety by this reference. This application is related to application Ser. No. 12/371,460, filed on Feb. 13, 2009, now U.S. Pat. No. 7,657,702.

BACKGROUND OF THE INVENTION

This invention pertains to the field of semiconductor non-volatile data storage system architectures and their methods of operation, and has application to data storage systems based on flash electrically erasable and programmable read-only memories (EEPROMs).

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks, wherein a block contains the smallest number of cells (unit of erase) that are erasable at one time.

In one commercial form, each block contains enough cells to store one sector of user data plus some overhead data related to the user data and/or to the block in which it is stored. The amount of user data included in a sector is the standard 512 bytes in one class of such memory systems but can be of some other size. Because the isolation of individual blocks of cells from one another that is required to make them individually erasable takes space on the integrated circuit chip, another class of flash memories makes the blocks significantly larger so there is less space required for such isolation. But since it is also desired to handle user data in much smaller sectors, each large block is often further partitioned into individually addressable pages that are the basic unit for reading and programming user data (unit of programming and/or reading). Each page usually stores one sector of user data, but a page may store a partial sector or multiple sectors. A "sector" is used herein to refer to an amount of user data that is transferred to and from the host as a unit.

The subsystem controller in a large block system performs a number of functions including the translation between logical addresses (LBAs) received by the memory sub-system from a host, and physical block numbers (PBNs) and page addresses within the memory cell array. This translation often involves use of intermediate terms for a logical block number (LBN) and logical page. The controller also manages the low level flash circuit operation through a series of commands that it issues to the flash memory devices via an interface bus. Another function the controller performs is to maintain the integrity of data stored to the subsystem through various means, such as by using an error correction code (ECC).

In an ideal case, the data in all the pages of a block are usually updated together by writing the updated data to the pages within an unassigned, erased block, and a logical-to-physical block number table is updated with the new address. The original block is then available to be erased. However, it is more typical that the data stored in a number of pages less than all of the pages within a given block must be updated. The data stored in the remaining pages of the given block remains unchanged. The probability of this occurring is higher in systems where the number of sectors of data stored per block is higher. One technique now used to accomplish such a partial block update is to write the data of the pages to be updated into a corresponding number of the pages of an unused erased block and then copy the unchanged pages from the original block into pages of the new block. The original block may then be erased and added to an inventory of unused blocks in which data may later be programmed. Another technique similarly writes the updated pages to a new block but eliminates the need to copy the other pages of data into the new block by changing the flags of the pages in the original block which are being updated to indicate they contain obsolete data. Then when the data are read, the updated data read from pages of the new block are combined with the unchanged data read from pages of the original block that are not flagged as obsolete.

SUMMARY OF THE INVENTION

According to one principal aspect of the present invention, briefly and generally, both the copying of unchanged data from the original to the new blocks and the need to update flags within the original block are avoided when the data of fewer than all of the pages within a block are being updated. This is accomplished by maintaining both the superceded data pages and the updated pages of data with a common logical address. The original and updated pages of data are then distinguished by the relative order in which they were programmed. During reading, the most recent data stored in the pages having the same logical address are combined with the unchanged pages of data while data in the original versions of the updated pages are ignored. The updated data can be written to either pages within a different block than the original data, or to available unused pages within the same block. In one specific implementation, a form of time stamp is stored with each page of data that allows determining the relative order that pages with the same logical address were written. In another specific implementation, in a system where pages are programmed in a particular order within the blocks, a form of time stamp is stored with each block of data, and the most recent copy of a page within a block is established by its physical location within the block.

These techniques avoid both the necessity for copying unchanged data from the original to new block and the need to change a flag or other data in the pages of the original block whose data have been updated. By not having to change a flag or other data in the superceded pages, a potential of disturbing the previously written data in adjacent pages of that same block that can occur from such a writing operation is eliminated. Also, a performance penalty of the additional program operation is avoided.

A further operational feature, which may be used in conjunction with the above summarized techniques, keeps track of the logical offset of individual pages of data within the individual memory cell blocks, so that the updated data need not be stored with the same physical page offset as the superceded data. This allows more efficient use of the pages of new blocks, and even allows the updated data to be stored in any erased pages of the same block as the superceded data.

Another principal aspect of the present invention groups together two or more blocks positioned in separate units of the memory array (also termed "sub-arrays") for programming and reading together as part of a single operation. Such a multiple block group is referenced herein as a "metablock." Its component blocks may be either all located on a single memory integrated circuit chip, or, in systems using more than one such chip, located on two or more different chips. When data in fewer than all of the pages of one of these blocks is updated, the use of another block in that same unit is normally required. Indeed, the techniques described above, or others, may be employed separately with each block of the metablock. Therefore, when data within pages of more than one block of the metablock are updated, pages within more than one additional block are required to be used. If there are four blocks of four different memory units that form the metablock, for example, there is some probability that up to an additional four blocks, one in each of the units, will be used to store updated pages of the original blocks. One update block is potentially required in each unit for each block of the original metablock. In addition, according to the present invention, updated data from pages of more than one of the blocks in the metablock can be stored in pages of a common block in only one of the units. This significantly reduces the number of unused erased blocks that are needed to store updated data, thereby making more efficient use of the available memory cell blocks to store data. This technique is particularly useful when the memory system frequently updates single pages from a metablock.

Additional aspects, features and advantages of the present invention are included in the following description of exemplary embodiments, which description should be read in conjunction with the accompanying drawings.

BRIEF DESCRIPTION OF THE DRAWINGS

FIGS. 5A and 5B are tables of corresponding logical and physical block addresses for each of the original and new blocks of FIG. 4, respectively;

FIGS. 7A and 7B are tables of corresponding logical and physical page addresses for the original and new blocks of FIG. 6, respectively;

FIG. 8 illustrates an example of an improved process of updating data in less than all of the pages of a multi-paged block;

FIG. 9 is a table of corresponding logical and physical page numbers for the new block of FIG. 8;

FIG. 10 provides an example of a layout of the data in a page shown in FIG. 8;

FIG. 12 is a table of corresponding logical and physical page numbers for the new block of FIG. 11;

FIG. 13 illustrates one way to read the updated data in the blocks of FIG. 11;

DESCRIPTION OF EXISTING LARGE BLOCK MANAGEMENT TECHNIQUES

Figure 1:
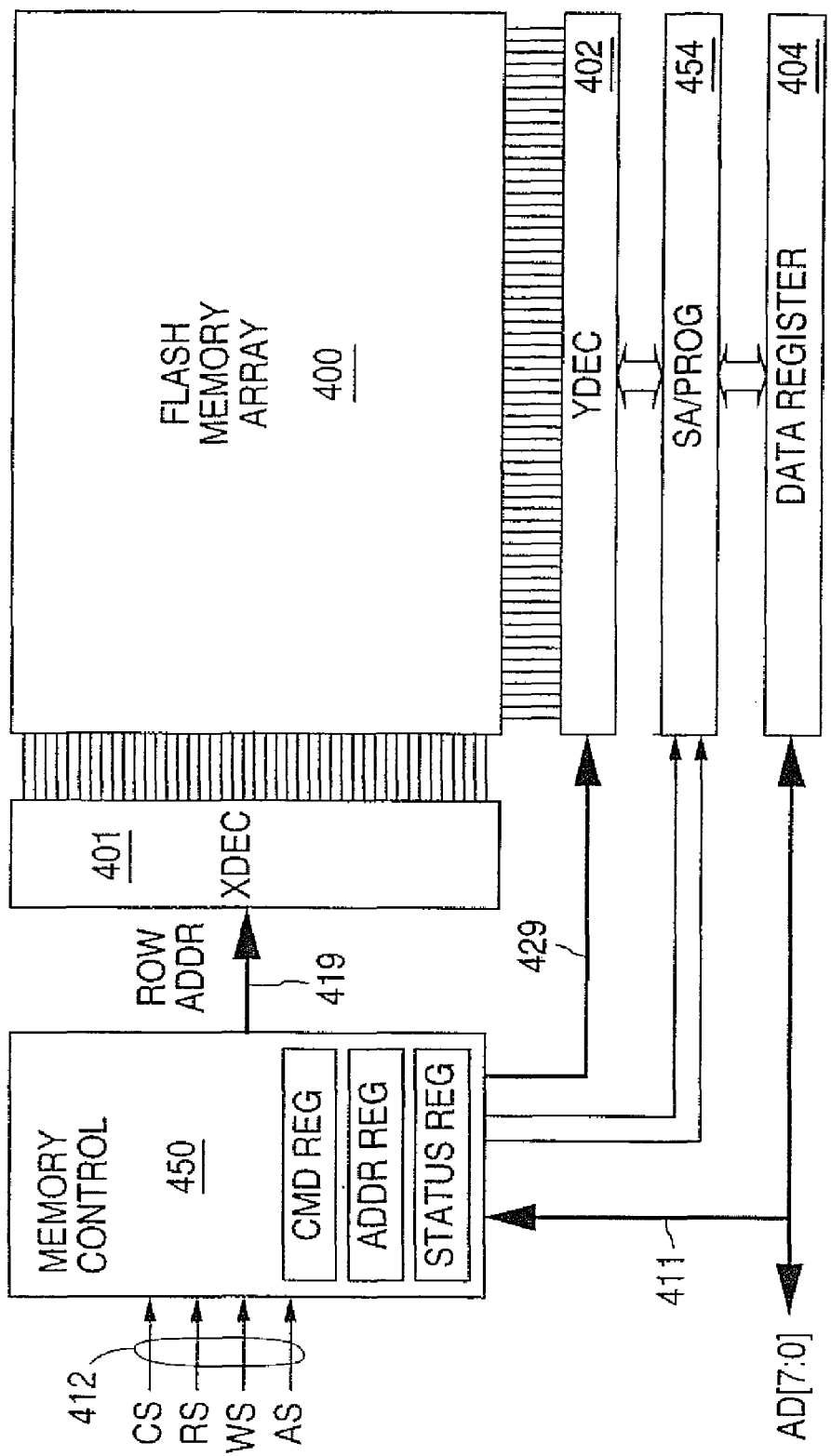
FIG. 1 is a block diagram of a typical prior art flash EEPROM memory array with memory control logic, data and address registers.

FIG. 1 shows a typical flash memory device internal architecture. The primary features include an input/output (I/O) bus 411 and control signals 412 to interface to an external controller, a memory control circuit 450 to control internal memory operations with registers for command, address and status signals. One or more arrays 400 of flash EEPROM cells are included, each array having its own row decoder (XDEC) 401 and column decoder (YDEC) 402, a group of sense amplifiers and program control circuitry (SA/PROG) 454 and a data register 404. Presently, the memory cells usually include one or more conductive floating gates as storage elements but other long term electron charge storage elements may be used instead. The memory cell array may be operated with two levels of charge defined for each storage element to therefore store one bit of data with each element. Alternatively, more than two storage states may be defined for each storage element, in which case more than one bit of data is stored in each element.

If desired, a plurality of arrays 400, together with related X decoders, Y decoders, program/verified circuitry, data registers, and the like are provided, for example as taught by U.S. Pat. No. 5,890,192, issued Mar. 30, 1999, and assigned to Sandisk Corporation, the assignee of this application, which is hereby incorporated by this reference. Related memory system features are described in co-pending patent application Ser. No. 09/505,555, filed Feb. 17, 2000 by Kevin Conley et al., which application is expressly incorporated herein by this reference.

The external interface I/O bus 411 and control signals 412 can include the following:

CS—Chip Select. Used to activate flash memory interface.
RS—Read Strobe. Used to indicate the I/O bus is being used to transfer data from the memory array.
WS—Write Strobe. Used to indicate the I/O bus is being used to transfer data to the memory array.
AS—Address Strobe. Indicates that the I/O bus is being used to transfer address information.
AD[7:0]—Address/Data Bus This I/O bus is used to transfer data between controller and the flash memory command, address and data registers of the memory control 450.

This interface is given only as an example as other signal configurations can be used to give the same functionality. FIG. 1 shows only one flash memory array 400 with its related components, but a multiplicity of such arrays can exist on a single flash memory chip that share a common interface and memory control circuitry but have separate XDEC, YDEC, SA/PROG and DATA REG circuitry in order to allow parallel read and program operations.

Data is transferred from the memory array through the data register 404 to an external controller via the data registers' coupling to the I/O bus AD[7:0] 411. The data register 404 is also coupled the sense amplifier/programming circuit 454. The number of elements of the data register coupled to each sense amplifier/programming circuit element may depend on the number of bits stored in each storage element of the memory cells, flash EEPROM cells each containing one or more floating gates as the storage elements. Each storage element may store a plurality of bits, such as 2 or 4, if the memory cells are operated in a multi-state mode. Alternatively, the memory cells may be operated in a binary mode to store one bit of data per storage element.

The row decoder 401 decodes row addresses for the array 400 in order to select the physical page to be accessed. The row decoder 401 receives row addresses via internal row address lines 419 from the memory control logic 450. A column decoder 402 receives column addresses via internal column address lines 429 from the memory control logic 450.

Figure 2:
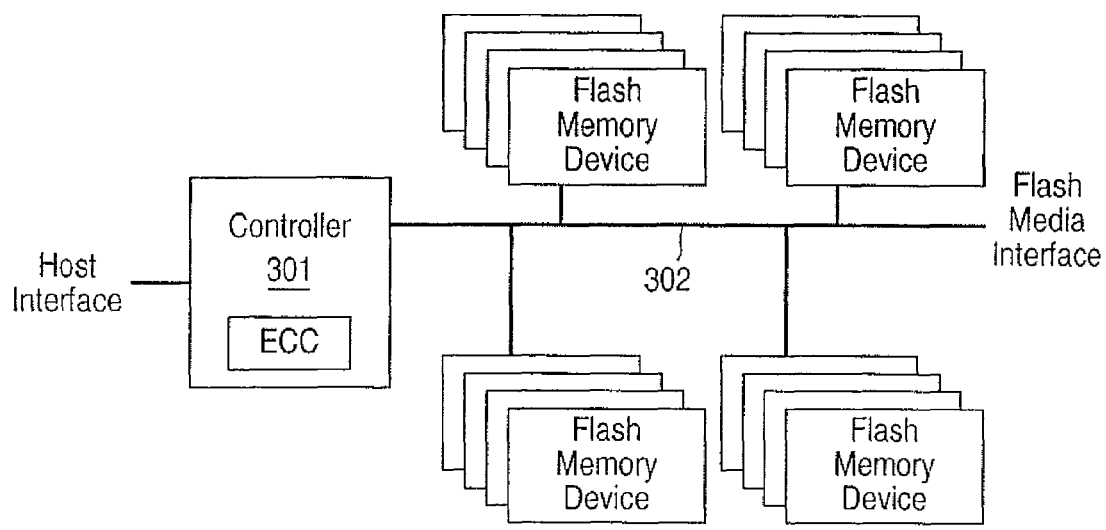
FIG. 2 illustrates an architecture utilizing memories of FIG. 1 with a system controller.

FIG. 2 shows an architecture of a typical non-volatile data storage system, in this case employing flash memory cells as the storage media. In one form, this system is encapsulated within a removable card having an electrical connector extending along one side to provide the host interface when inserted into a receptacle of a host. Alternatively, the system of FIG. 2 may be embedded into a host system in the form of a permanently installed embedded circuit or otherwise. The system utilizes a single controller 301 that performs high level host and memory control functions. The flash memory media is composed of one or more flash memory devices, each such device often formed on its own integrated circuit chip. The system controller and the flash memory are connected by a bus 302 that allows the controller 301 to load command, address, and transfer data to and from the flash memory array. The controller 301 interfaces with a host system (not shown) with which user data is transferred to and from the flash memory array. In the case where the system of FIG. 2 is included in a card, the host interface includes a mating plug and socket assembly (not shown) on the card and host equipment.

The controller 301 receives a command from the host to read or write one or more sectors of user data starting at a particular logical address. This address may or may not align with a boundary of a physical block of memory cells.

Figures 3, 4:
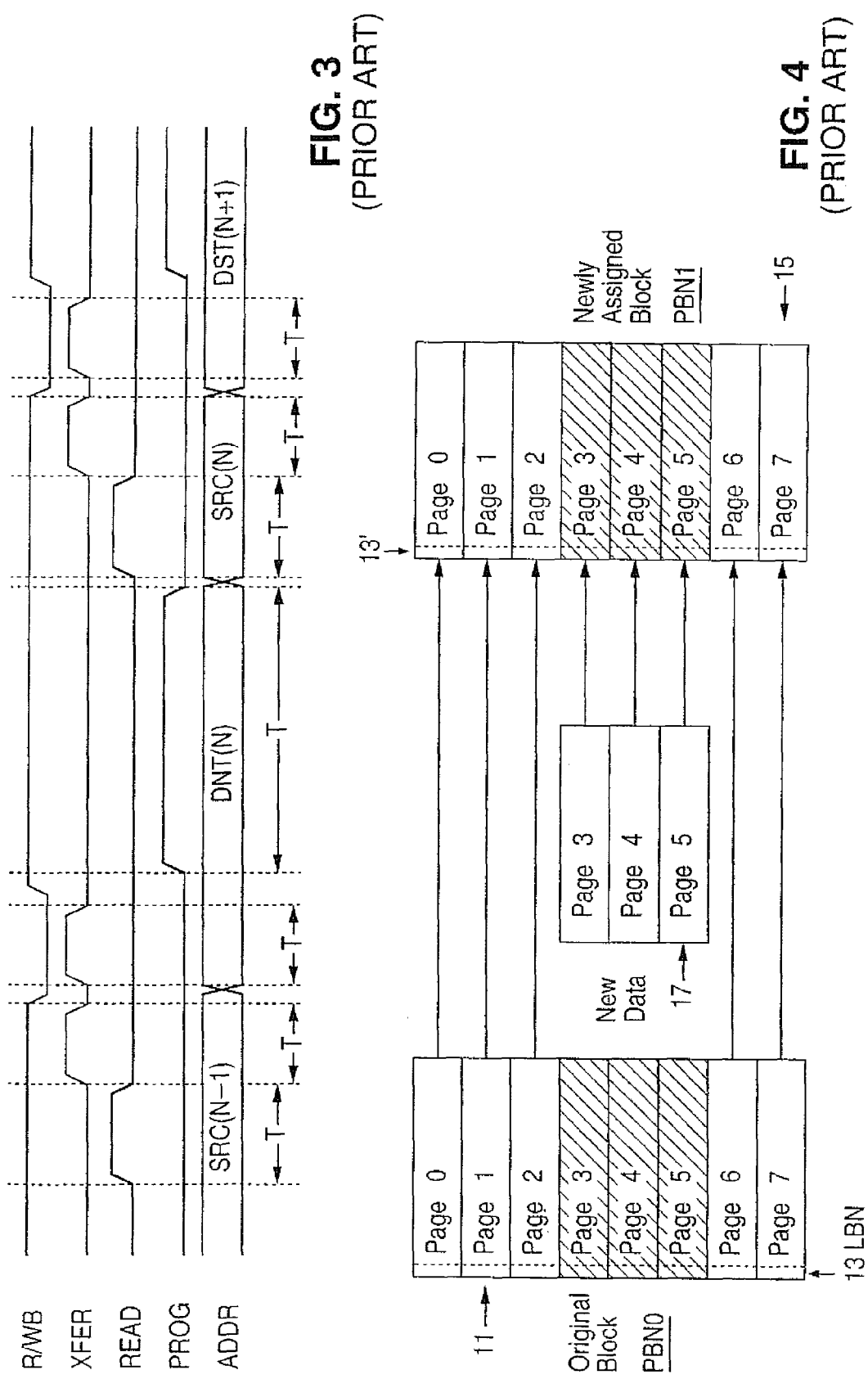
FIG. 3 is a timing diagram showing a typical copy operation of the memory system of FIG. 2.
FIG. 4 illustrates an existing process of updating data in less than all of the pages of a multi-paged block.

In some prior art systems having large capacity memory cell blocks that are divided into multiple pages, as discussed above, the data from a block that is not being updated needs to be copied from the original block to a new block that also contains the new, updated data being written by the host. This technique is illustrated in FIG. 4, wherein two of a large number of blocks of memory are included. One block 11 (PBN0) is illustrated to be divided into 8 pages for storing one sector of user data in each of its pages. Overhead data fields contained within each page include a field 13 containing the LBN of the block 11. The order of the logical pages within a logical block is fixed with respect to the corresponding physical pages within a physical block. A second similarly configured block 15 (PBN1) is selected from an inventory of unused, erased blocks. Data within pages 3-5 of the original block 11 are being updated by three pages of new data 17. The new data is written into the corresponding pages 3-5 of the new block 15, and user data from pages 0-2, 6 and 7 of the block 11 are copied into corresponding pages of the new block 15. All pages of the new block 15 are preferably programmed in a single sequence of programming operations. After the block 15 is programmed, the original block 11 can be erased and placed in inventory for later use. The copying of data between the blocks 11 and 15, which involves reading the data from one or more pages in the original block and subsequently programming the same data to pages in a newly assigned block, greatly reduces the write performance and usable lifetime of the storage system.

With reference to FIGS. 5A and 5B, partial tables show mapping of the logical blocks into the original and new physical blocks 11 and 15 before (FIG. 5A) and after (FIG. 5B) the updating of data described with respect to FIG. 4. Before the data update, the original block 11, in this example, stores pages 0-7 of LBN0 into corresponding pages 0-7 of PBN0. After the data update, the new block 15 stores pages 0-7 of LBN0 in corresponding pages 0-7 of PBN1. Receipt of a request to read data from LBN0 is then directed to the physical block 15 instead of the physical block 11. In a typical controller operation, a table in the form of that shown in FIGS. 5A and 5B is built from the LBN field 13 read from a physical page and knowledge of the PBN that is addressed when reading the data field 13. The table is usually stored in a volatile memory of the controller for ease of access, although only a portion of a complete table for the entire system is typically stored at any one time. A portion of the table is usually formed immediately in advance of a read or programming operation that involves the blocks included in the table portion.

Figure 6:
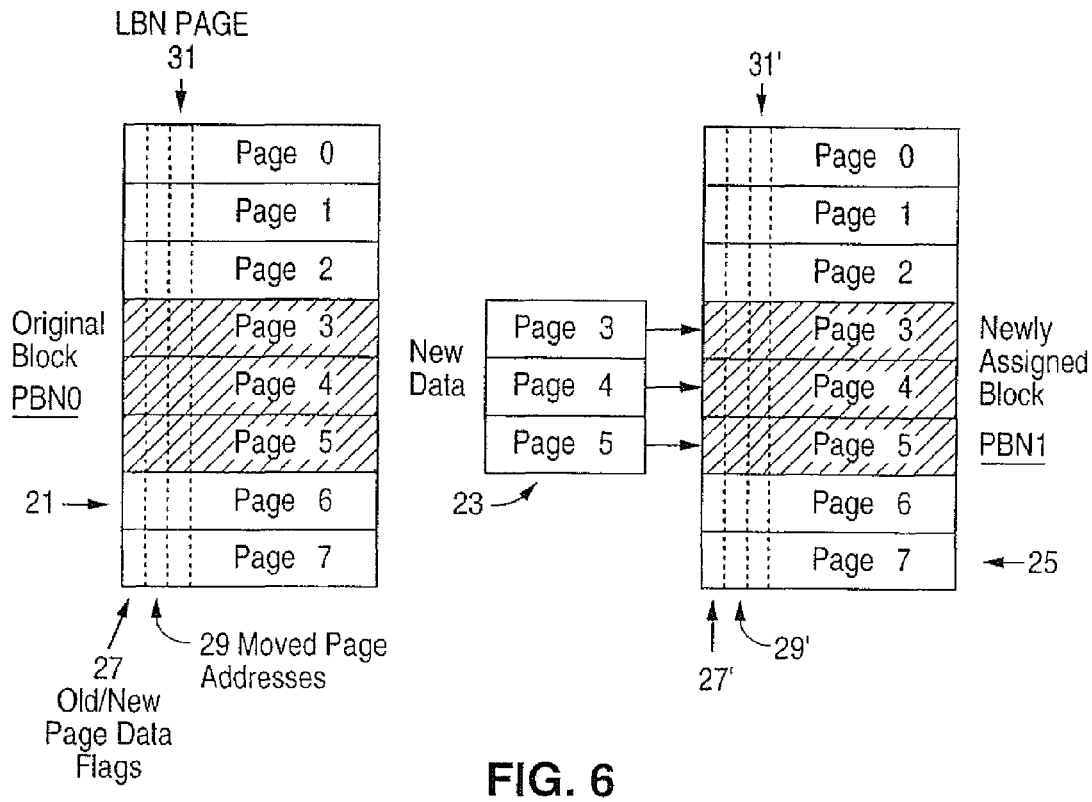
FIG. 6 illustrates another existing process of updating data in less than all of the pages of a multi-paged block.

In other prior art systems, flags are recorded with the user data in pages and are used to indicate that pages of data in the original block that are being superceded by the newly written data are invalid. Only the new data is written to the newly assigned block. Thus the data in pages of the block not involved in the write operation but contained in the same physical block as the superceded data need not be copied into the new block. This operation is illustrated in FIG. 6, where pages 3-5 of data within an original block 21 (PBN0) are again being updated. Updated pages 3-5 of data 23 are written into corresponding pages of a new block 25. As part of the same operation, an old/new flag 27 is written in each of the pages 3-5 to indicate the data of those pages is old, while the flag 27 for the remaining pages 0-2, 6 and 7 remains set at "new". Similarly, the new PBN1 is written into another overhead data field of each of the pages 3-5 in the block 21 to indicate where the updated data are located. The LBN and page are stored in a field 31 within each of the physical pages.

FIGS. 7A and 7B are tables of the correspondence between the data LBN/page and the PBN/page before (FIG. 7A) and after (FIG. 7B) the data update is complete. The unchanged pages 0-2, 6 and 7 of the LBN remain mapped into PBN0 while the updated pages 3-5 are shown to reside in PBN1. The table of FIG. 7B is built by the memory controller by reading the overhead data fields 27, 29 and 31 of the pages within the block PBN0 after the data update. Since the flag 27 is set to "old" in each of pages 3-5 of the original block PBN0, that block will no longer appear in the table for those pages. Rather, the new block number PBN1 appears instead, having been read from the overhead fields 29' of the updated pages. When data are being read from LBN0, the user data stored in the pages listed in the right column of FIG. 7B are read and then assembled in the order shown for transfer to the host.

Various flags are typically located in the same physical page as the other associated overhead data, such as the LBN and an ECC. Thus, to program the old/new flags 27, and others, in pages where the data has been superceded requires that a page support multiple programming cycles. That is, the memory array must have the capability that its pages can be programmed in at least at least two stages between erasures. Furthermore, the block must support the ability to program a page when other pages in the block with higher offsets or addresses have been already programmed. A limitation of some flash memories however prevents the usage of such flags by specifying that the pages in a block can only be programmed in a physically sequential manner. Furthermore, the pages support a finite number of program cycles and in some cases additional programming of programmed pages is not permitted.

What is needed is a mechanism by which data that partially supercedes data stored in an existing block can be written without either copying unchanged data from the existing block or programming flags to pages that have been previously programmed.

DESCRIPTION OF EXEMPLARY
EMBODIMENTS OF THE INVENTION

There are many different types of flash EEPROM, each of which presents its own limitations that must be worked around to operate a high performance memory system formed on a small amount of integrated circuit area. Some do not provide for writing any data into a page that has already been programmed, so updating flags in a page that contains superceded data, as described above, is not possible. Others allow such flags to be written but doing so in pages whose data is being superceded can disturb data in other pages of the same block that remain current.

An example memory system where this has been found to be a problem is a NAND type, where a column of memory cells is formed as a series circuit string between a bit line and a common potential. Each word line extends across a row of memory cells formed of one cell in each such string. Such a memory is particularly susceptible to such memory state disturbs when being operated in a multi-state mode to store more than one bit of data in each such cell. Such operation divides an available window of a memory cell transistor threshold voltage range into narrow non-overlapping voltage level ranges, each range becoming narrower as the number of levels, and thus the number of bits being stored in each cell, are increased. For example, if four threshold ranges are used, two bits of data are stored in each cell's storage element. And since each of the four threshold voltage ranges is necessarily small, the chance of the state of a cell being disturbed by programming other cells in the same block is increased with multi-state operation. In this case, the writing of the old/new or other flags, as described with respect to FIGS. 6, 7A and 7B, cannot be tolerated.

A common feature of each of the existing memory management techniques described above with respect to FIGS. 4-7B is that a logical block number (LBN) and page offset is mapped within the system to at most two physical block numbers (PBNs). One block is the original block and the other contains the updated page data. Data are written to the page location in the block corresponding to the low order bits of its logical address (LBA). This mapping is typical in various types of memory systems. In the techniques described below, pages containing updated data are also assigned the same LBN and page offsets as the pages whose data has been superceded. But rather than tagging the pages containing original data as being superceded, the memory controller distinguishes the pages containing the superceded data from those containing the new, updated version either (1) by keeping track of the order in which the pages having the same logical addresses were written, such as by use of a counter, and/or (2) from the physical page addresses wherein, when pages are written in order within blocks from the lowest page address to the highest, the higher physical address contains the most recent copy of the data. When the data is accessed for reading, therefore, those in the most current pages are used in cases where there are pages containing superceded data that have the same logical addresses, while the superceded data are ignored.

A first specific implementation of this technique is described with respect to FIGS. 8 and 9. The situation is the same in this example as that in the prior art techniques described with respect to FIGS. 4-7B, namely the partial re-write of data within a block 35, although each block is now shown to contain 16 pages. New data 37 for each of the pages 3-5 of the block 35 (PBN 35) is written into three pages of a new block 39 (PBN1) that has previously been erased, similar to that described previously. A LBN and page offset overhead data field 41 written into the pages of PBN1 that contain the updated data is the same as that in the pages of the superceded data in the initial block PBN0. The table of FIG. 9, formed from the data within the fields 41 and 41', shows this. The logical LBN and page offsets, in the first column, are mapped into both the first physical block (PBN0), in the second column, and, for the pages that have been updated, also into the second physical block (PBN1) in the third column. The LBN and logical page offsets 41' written into each of the three pages of updated data within the new block PBN1 are the same as those 41 written into each of a corresponding logical page of the original block PBN0.

In order to determine which of two pages having the same LBN and page offset contains the updated data, each page contains another overhead field 43 that provides an indication of its time of programming, at least relative to the time that other pages with the same logical address are programmed. This allows the controller to determine, when reading the data from the memory, the relative ages of the pages of data that are assigned the same logical address.

There are several ways in which the field 43, which contains a form of time stamp, may be written. The most straight forward way is to record in that field, when the data of its associated page is programmed, the output of a real-time clock in the system. Later programmed pages with the same logical address then have a later time recorded in the field 43. But when such a real-time clock is not available in the system, other techniques can be used. One specific technique is to store the output of a modulo-N counter as the value of the field 43. The range of the counter should be one more than the number of pages that are contemplated to be stored with the same logical page number. When updating the data of a particular page in the original block PBN0, for example, the controller first reads the count stored in the field 43 of the page whose data are being updated, increments the count by some amount, such as one, and then writes that incremented count in the new block PBN1 as the field 43'. The counter, upon reaching a count of N+1, rolls over to 0. Since the number of blocks with the same LBN is less than N, there is always a point of discontinuity in the values of stored counts. It is easy then to handle the rollover with normalized to the point of discontinuity.

The controller, when called upon to read the data, easily distinguishes between the new and superceded pages' data by comparing the counts in the fields 43 and 43' of pages having the same LBA and page offset. In response to a need to read the most recent version of a data file, data from the identified new pages are then assembled, along with original pages that have not been updated, into the most recent version of the data file.

It will be noted that, in the example of FIG. 8, the new data pages 37 are stored in the first three pages 0-2 of the new block PBN1, rather than in the same pages 3-5 which they replace in the original block PBN0. By keeping track of the individual logical page numbers, the updated data need not necessarily be stored in the same page offset of the new block as that of the old block where superceded data is contained. Page(s) of updated data can also be written to erased pages of the same block as the page of data being superceded.

As a result, there is no constraint presented by the techniques being described that limit which physical page new data can be written into. But the memory system in which these techniques are implemented may present some constraints. For example, one NAND system requires that the pages within the blocks be programmed in sequential order. That means that programming of the middle pages 3-5, as done in the new block 25 (FIG. 6), wastes the pages 0-2, which cannot later be programmed. By storing the new data 37 in the first available pages of the new block 39 (FIG. 8) in such a restrictive system, the remaining pages 3-7 are available for later use to store other data. Indeed, if the block 39 had other data stored in its pages 0-4 at the time the three pages of new data 37 were being stored, the new data could be stored in the remaining unused pages 5-7. This makes maximum use of the available storage capacity for such a system.

An example of the structure of data stored in an individual page of the blocks of FIG. 8 is shown in FIG. 10. The largest part is user data 45. An error correction code (ECC) 47 calculated from the user data is also stored in the page. Overhead data 49, including the LBN and page tag 41 (logical page offset), the time stamp 43 and an ECC 51 calculated from the overhead data are also stored in the page. By having an ECC 50 covering the overhead data that is separate from the user data ECC 47, the overhead 49 may be read separately from the user data and evaluated as valid without the need to transfer all of the data stored in the page. Alternatively, however, where the separate reading of the overhead data 49 is not a frequent event, all of the data in the page may be covered by a single ECC in order to reduce the total number of bits of ECC in a page.

A second specific implementation of the inventive technique can also be described with respect to FIG. 8. In this example, the time stamp is used only to determine the relative age of the data stored in blocks, while the most recent pages among those that carry the same LBN and page number are determined by their relative physical locations. The time stamp 43 then does not need to be stored as part of each page. Rather, a single time stamp can be recorded for each block, either as part of the block or elsewhere within the non-volatile memory, and is updated each time a page of data is written into the block. Data is then read from pages in an order of descending physical address, starting from the last page of the most recently updated block containing data pages having the same LBN.

In FIG. 8, for example, the pages are first read in the new block PBN1 from the last (page 15) to the first (page 0), followed by reading the pages of the original block PBN0 in the same reverse order. Once logical pages 3, 4 and 5 have been read from the new block PBN1, the superceded data in those pages of the original block PBN0 that are identified by the same logical page numbers can be skipped during the reading process. Specifically, physical pages 3, 4 and 5 of the old block PBN0 are skipped during reading, in this example, once the controller determines that their LBN/pages 41 are the same as those of the pages already read from the new block PBN1. This process can increase the speed of reading and reduce the number of overhead bits 49 that need to be stored for each page. Further, when this reverse page reading technique is employed, the table of FIG. 9 used by the controller during a reading operation can be simplified into the form of FIGS. 5A and 5B. Only an identity of those physical blocks containing data of a common logical block and the relative times that the physical blocks were programmed need to be known in order to carry out this efficient reading process.

Figure 11:
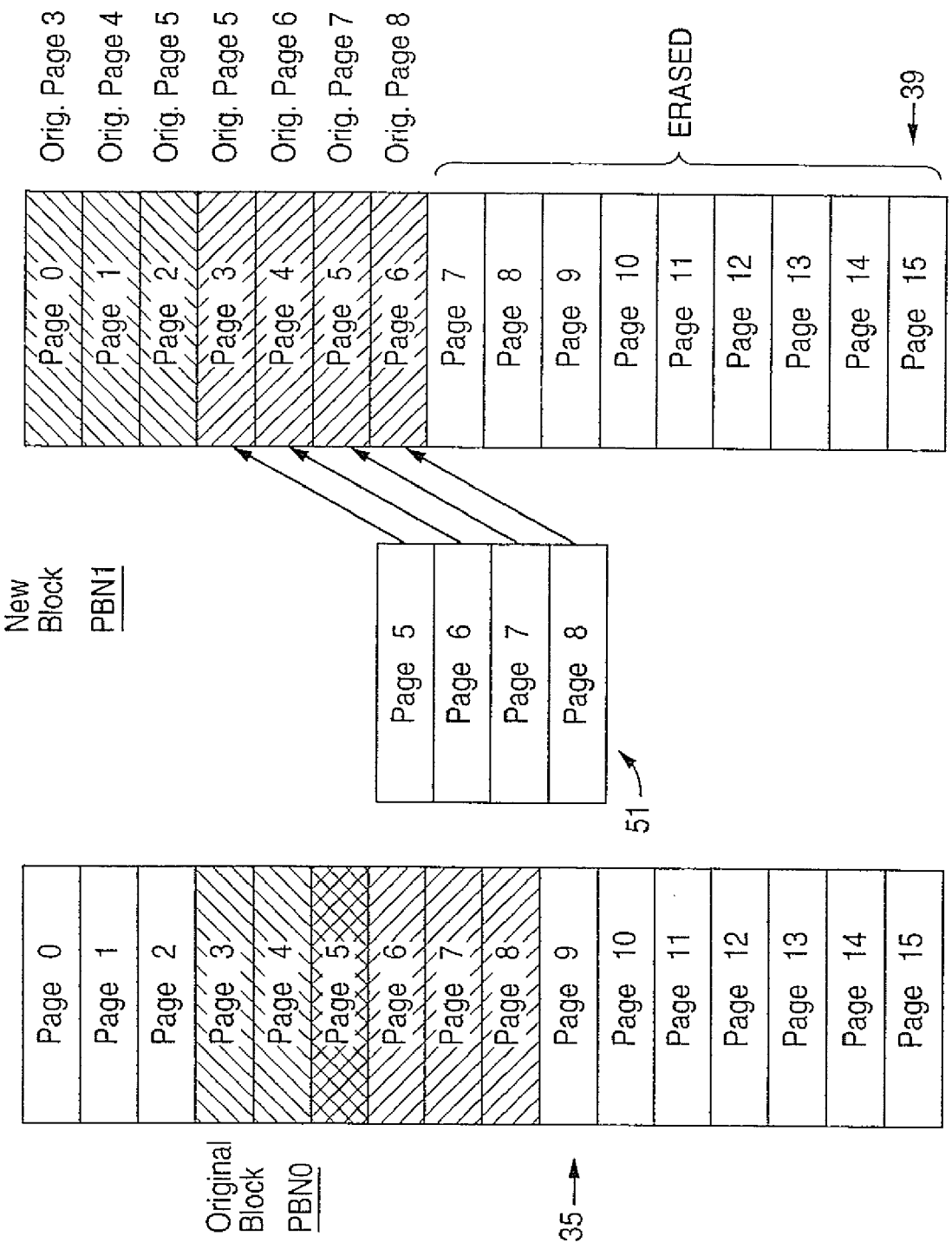
FIG. 11 illustrates a further development of the example of FIG. 8.

FIG. 11 illustrates an extension of the example of FIG. 8 by including a second update to the data originally written in the block PBN0. New data 51 for logical pages 5, 6, 7 and 8 is written to the respective physical pages 3, 4, 5 and 6 of the new block PBN1, along with their LBN and page number. Note, in this example, that the data of logical page 5 is being updated for the second time. During a reading operation that begins from the last page of the new block PBN1, the most recently written logical pages 8, 7, 6 and 5 of the data of interest are first read in that order. Thereafter, it will be noted that the LBN/page overhead field in physical page 2 of PBN1 is the same as that read from the physical page 3, so the user data of page 2 is not read. The physical pages 1 and 0 are then read. Next, the pages of the original block PBN0 are read, beginning with physical page 15. After reading physical pages 15-9, the controller will note that the LBN/page fields of each of pages 8-3 match those of pages whose data has already been read, so the old data need not be read from those pages. The efficiency of the reading process is thus improved. Finally, the original data of physical pages 2-0 are read since that data was not updated.

It will be noted that this example of reading pages in a reverse order efficiently sorts out the new data pages from the superceded data pages because data are written in physical page locations of an erased block in order from page 0 on. This technique is not limited to use with a memory system having such a specific programming constraint, however. So long as the order in which pages are programmed within a given block is known, the data from those pages may be read in the reverse order from which they were written. What is desired is that the most recently programmed pages having a common LBN with others that were earlier programmed be read first, and these are the most recently programmed pages. The most recent versions of updated pages are read first so that the superceded versions may easily be identified thereafter.

A table showing the correspondence between the logical data and physical page addresses for the example of FIG. 11 is given in FIG. 12. Although there have been two data updates, both are represented by the single column for the second block PBN1. The physical page noted in PBN1 for the logical page 5 is simply changed upon the second update to that page occurring. If the updating involves a third block, then another column is added for that other block. The table of FIG. 12, constructed by reading the overhead data from each of the pages in blocks to which data of a common LBN has been written, can be used by the first implementation when the reverse page reading technique is not used. When the reverse page reading technique described above is used, the table of FIG. 12 need be built only to identify a correspondence between an LBN and all PBNs containing data of that LBN.

An efficient way to organize pages of data being read from a physical block, where one or more of the pages has been updated, is illustrated by FIG. 13. Enough space is provided in a volatile memory of the controller to buffer at least several pages of data at a time, and preferably a full block of data. That is what is shown in FIG. 13. Sixteen pages of data, equal to the amount stored in a non-volatile memory block, are stored in the controller memory. Since the pages are most commonly read out of order, each page of data is stored in its proper position with respect to the other pages. For example, in the reverse page read operation of FIG. 11, logical page 8 if the first to be read, so it is stored in position 8 of the controller memory, as indicated by the "1" in a circle. The next is logical page 7, and so forth, until all pages of data desired by the host are read and stored in the controller memory. The entire set of page data is then transferred to the host without having to manipulate the order of the data in the buffer memory. The pages of data have already be organized by writing them to the proper location in the controller memory.

Figure 14:
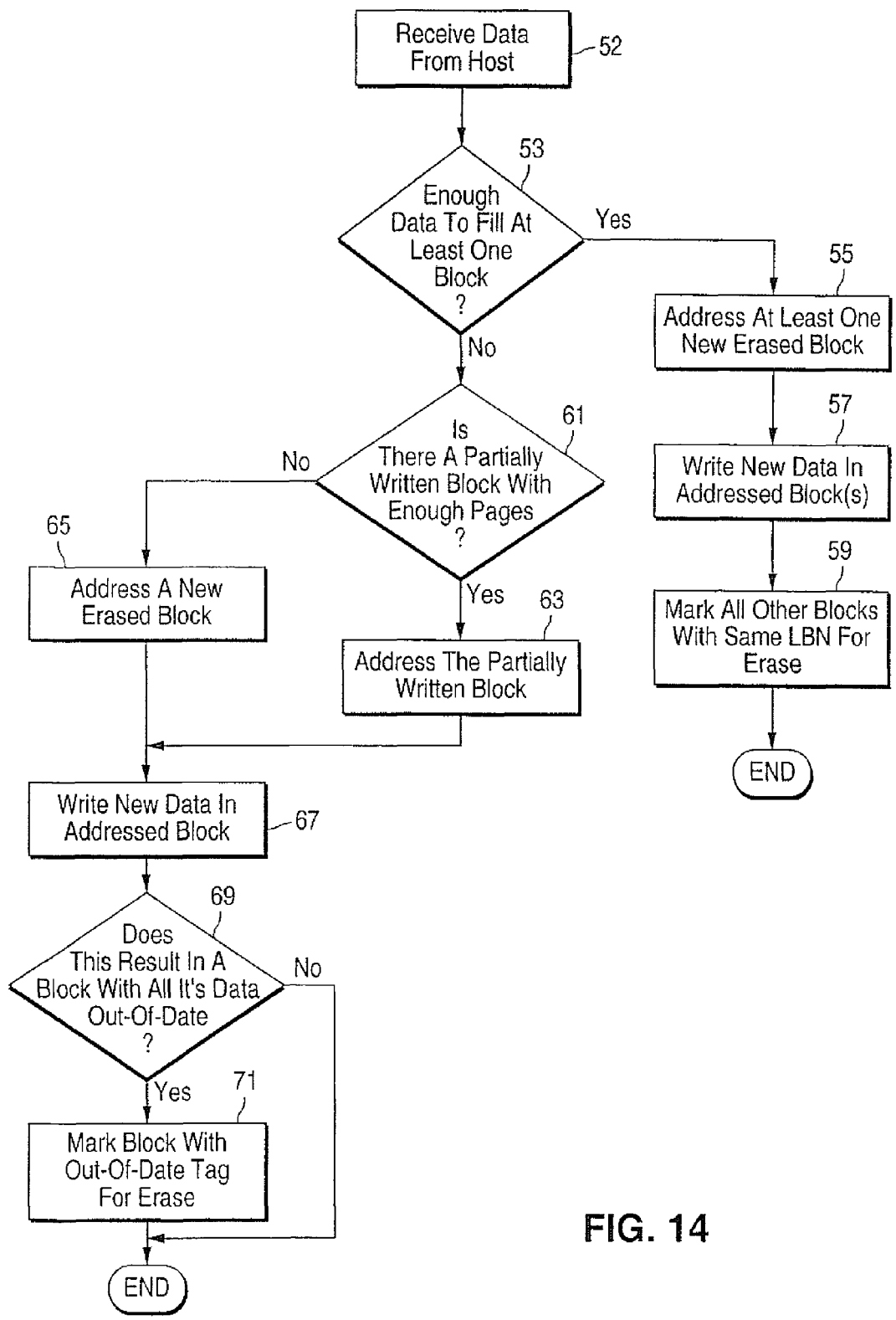
FIG. 14 is a flow diagram of a process of programming data into a memory system organized as illustrated in FIGS. 8 and 9.

A method of programming a non-volatile memory system that utilizes the techniques described with respect to FIGS. 8 and 9 is illustrated in the flow chart of FIG. 14. Data for pages of an existing file to be updated are received from a host system, as indicated by the block 52. It is first determined by a step 53 whether the number of pages of updated data to be stored is equal to or greater than the storage capacity of a block of the system, 16 pages being shown as the block capacity, for simplicity, in the above described example. If so, one or more unused, erased blocks are addressed, in a step 55, and the new data pages are written to the addressed block(s), in a step 57. Typically, the updating of one block or more of data will result in one or more blocks storing the data that have been superceded by the new data. If so, as indicated by a step 59, those blocks with superceded data are identified for erasure. For the purpose of increasing performance, it is preferable that erase operations occur in the background, or when host requested programming or reading operations are not taking place. After being erased, the blocks are returned to the inventory of unused, erased blocks for further use. Alternatively, erasure of the blocks can be deferred until they are needed for programming operations.

If, on the other hand, in the step 53, it is determined that there are fewer pages of new data than will utilize the full storage capacity of a block, a next step 61 determines whether there are enough unused pages in a block having some pages programmed with other data. If so, such a block is addressed, in a step 63. If not, a totally unused, erased block is addressed, in a step 65. In either case, in a step 67, the new data are programmed into unused pages of the addressed block. As part of this programming process, the LBN and page offset is written into the fields 41, and the time stamp into the fields 43 of each of the pages (FIG. 8) of the updated data, in the manner described above.

A desirable feature of the programming process is to make available for future programming any blocks that store only superceded data. So the question is asked, in a step 69, whether the data updating process has resulted in an entire block remaining with only superceded data. If so, such a block is queued for erasure, in a step 71, and the process is then completed. If not, the step 71 is omitted and the data update is finished.

Metablock Operation

Figure 15:
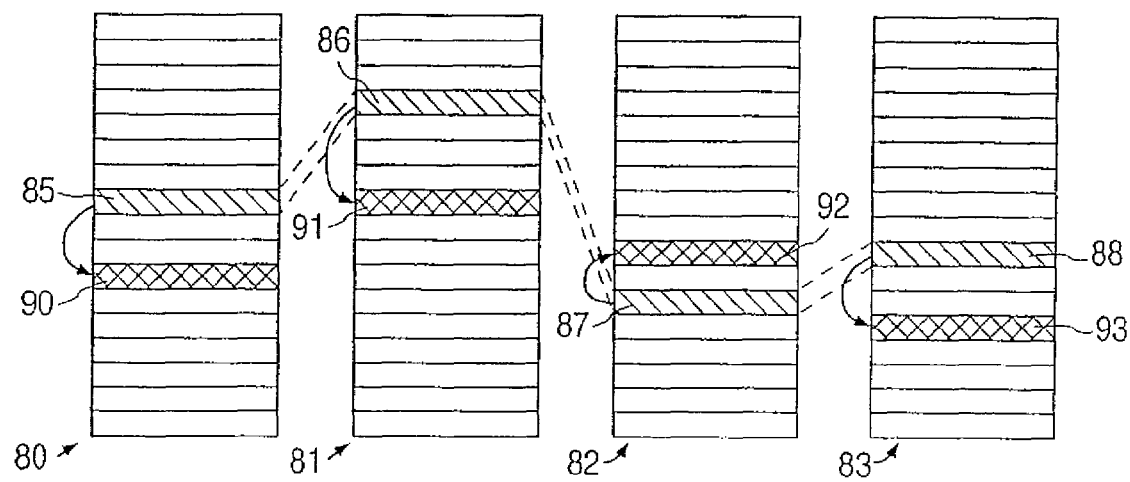
FIG. 15 illustrates an existing multi-unit memory with blocks from the individual units being linked together into a metablock and FIG. 16 illustrates an improved method of updating data of a metablock in the multi-unit memory of FIG. 12 when the amount of updated data is much less that the data storage capacity of the metablock.

In order to improve performance by reducing programming time, a goal is to program as many cells in parallel as can reasonably be done without incurring other penalties. One implementation divides the memory array into largely independent sub-arrays or units, such as multiple units 80-83 of FIG. 15, each unit in turn being divided into a large number of blocks, as shown. Pages of data are then programmed at the same time into more than one of the units. Another configuration further combines one or more of these units from multiple memory chips. These multiple chips may be connected to a single bus (as shown in FIG. 2) or multiple independent busses for higher data throughput. An extension of this is to link blocks from different units for programming, reading and erasing together, an example being shown in FIG. 15. Blocks 85-88 from respective ones of the units 80-83 can be operated together as a metablock, for example. As with the memory embodiments described above, each block, the smallest erasable group of the memory array, is typically divided into multiple pages, a page containing the smallest number of cells that are programmable together within the block. Therefore, a programming operation of the metablock shown in FIG. 15 will usually include the simultaneously programming of data into at least one page of each of the blocks 85-88 forming the metablock, which is repeated until the metablock is full or the incoming data has all been programmed. Other metablocks are formed of different blocks from the array units, one block from each unit.

In the course of operating such a memory, as with others, pages of data less than an entire block often need to be updated. This can be done for individual blocks of a metablock in the same manner as described above with respect to either of FIG. 4 or 6, but preferably by use of the improved technique described with respect to FIG. 8. When any of these three techniques are used to update data of one block of the metablock, an additional block of memory within the same unit is also used. Further, a data update may require writing new data for one or more pages of two or more of the blocks of a metablock. This can then require use of up to four additional blocks 90-93, one in each of the four units, to update a data file stored in the metablock, even though the data in only a few pages is being updated.

Figure 16:
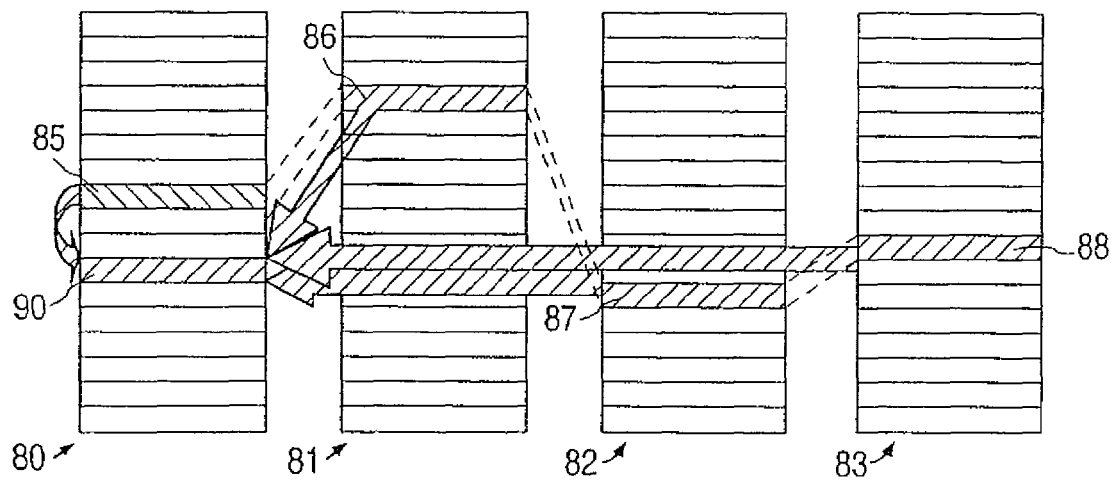

In order to reduce the number of blocks required for such partial block updates, according to another aspect of the present invention, updates to pages of data within any of the blocks of the illustrated metablock are made, as illustrated by FIG. 16, to a single additional block 90 in the memory unit 80, so long as unused pages in the block 80 remain. If, for example, data in three pages of the block 86 and two pages of the block 88 are being updated at one time, all five pages of the new data are written into the block 90. This can save the use of one block of memory, thereby to effectively increase the number of available erased blocks by one block. This helps avoid, or at least postpone, the time when an inventory of erased blocks becomes exhausted. If one or more pages from each of the four blocks 85-88 are being updated, all of the new data pages are programmed in the single block 90, thereby avoiding tying up an additional three blocks of memory to make the update. If the number of pages of new data exceed the capacity of an unused block, pages that the block 90 cannot accept are written to another unused block which may be in the same unit 80 or one of the other units 81-83.

Although the invention has been described with respect to various exemplary embodiments, it will be understood that the invention is entitled to protection within the full scope of the appended claims.

The invention claimed is:

1. A method of operating a non-volatile memory system, comprising:

providing a plurality of blocks of memory storage elements that are individually erasable as a unit and which are individually organized into a plurality of pages of memory storage elements that are individually programmable together, programming at least one page of data in one of the plurality of blocks;

programming at least one page of new data in one of said one or another of the plurality of blocks, the at least one page of new data rendering the at least one page of data to become at least one page of superceded data identifying the at least one page of superceded data and the at least one page of new data by a common logical address, recording an indication of a relative time of programming the at least one page of new data and the at least one page of superceded data; and wherein the at least one page of superceded data is less than all the data contained in said one block.

2. The method of claim 1, wherein the indication of a relative time of programming is recorded for the individual pages in which the new and superceded data are programmed, whereby the at least one page of new data is distinguishable from the at least one page of superceded data by their recorded indications of relative time of programming.

3. A method of operating a non-volatile memory system, comprising:

providing a plurality of blocks of memory storage elements that are individually erasable as a unit and which are individually organized into a plurality of pages of memory storage elements that are individually programmable together, programming at least one page of data in one of the plurality of blocks;

programming at least one page of new data in one of said one or another of the plurality of blocks, the at least one page of new data rendering the at least one page of data to become at least one page of superceded data, identifying the at least one page of superceded data and the at least one page of new data by a common logical address, recording an indication of a relative time of programming the at least one page of new data and the at least one page of superceded data; and wherein the data in at least another page of said one block that is not replaced are not copied into said one or another block as part of substituting the new data for the superceded data.

4. The method of claim 1, wherein nothing is written into the at least one page of superceded data as part of substituting the new data for the superceded data.

5. The method of claim 1, wherein recording an indication of a relative time of programming the new and superceded data includes storing a value of a clock at each of the times that the new and superceded data are programmed.

6. The method of claim 1, wherein recording an indication of a relative time of programming the new and superceded data includes storing a different value of a sequence of numbers at each of the times that the new and superceded data are programmed.

7. The method of either of claim 5 or 6, wherein storing the value indicating a relative time of programming the new and superceded data includes storing the individual values within the same pages as the new and superceded data to which the values relate.

8. The method of claim 1, wherein programming the new data into at least one page of another said one or another of the plurality of blocks includes programming the new data into a first available unused pages within said one or another block in a predefined order.

9. The method of claim 1, wherein identifying the at least one page of superceded data and the at least one page of new data by a common logical address includes recording at least part of the common logical address in the individual pages as overhead data.

10. The method of claim 9, including building a table in volatile memory including multiple physical block addresses for the common logical address.

11. A method of reading data that has been updated according to claim 2, comprising:

reading pages of data from said one block and, if new data has been programmed thereinto, said another block, identifying any multiple pages of data that have the same logical address, utilizing the recorded relative time of programming the new and superceded data to identify a most current of any pages having the same logical address, and assembling data in the most current of any pages having the same logical address along with pages in said at least another page of said one block that have not been updated.

12. A method of operating a non-volatile memory system, comprising:

providing a plurality of blocks of memory storage elements that are individually erasable as a unit and which are individually organized into a plurality of pages of memory storage elements that are individually programmable together, programming at least one page of data in one of the plurality of blocks;

programming at least one page of new data in one of said one or another of the plurality of blocks, the at least one page of new data rendering the at least one page of data to become at least one page of superceded data, wherein pages within the individual blocks are programmed in a designated order, identifying the at least one page of superceded data and the at least one page of new data by a common logical address, reading pages of data within said one and, if new data has been programmed thereinto, another block in a reverse order from which they were programmed, and passing over any pages of data so read which have the same logical page address as a page whose data has already been read; and wherein the at least one page of superceded data is less than all the data contained in said one block.

13. The method of either one of claim 11 or 12, additionally comprising operating the individual memory storage elements with more than two storage states, thereby storing more than one bit of data in each storage element, and reading pages of data includes reading the more than two storage states from the individual memory storage elements.

14. The method of claim 1, additionally comprising operating storage elements of the individual memory cells with more than two storage states, thereby storing more than one bit of data in each storage element.

15. The method of claim 14, wherein the storage elements include individual floating gates.

16. The method of claim 1, wherein the non-volatile memory system is formed within an enclosed card having an electrical connector along one edge thereof that operably connects with a host system.

* * * * *